(12) United States Patent
Higashi

(10) Patent No.: US 7,415,318 B2
(45) Date of Patent: Aug. 19, 2008

(54) METHOD AND APPARATUS FOR MANUFACTURING SEMICONDUCTOR DEVICE

(75) Inventor: Tohru Higashi, Aizuwakamatsu (JP)

(73) Assignee: Spansion LLC, Sunnyvale, CA (US)

( * ) Notice: Subject to any disclaimer, the term of this patent is extended or adjusted under 35 U.S.C. 154(b) by 56 days.

(21) Appl. No.: 11/244,166

(22) Filed: Oct. 6, 2005

(65) Prior Publication Data
US 2006/0039011 A1 Feb. 23, 2006

Related U.S. Application Data

(62) Division of application No. 10/682,299, filed on Oct. 10, 2003, now Pat. No. 6,979,577.

(30) Foreign Application Priority Data

Oct. 11, 2002 (JP) ............................ 2002-298749

(51) Int. Cl.
*G06F 19/00* (2006.01)
*H01L 21/8283* (2006.01)
(52) U.S. Cl. ...................... 700/121; 438/202
(58) Field of Classification Search ................ 700/121, 700/98, 182, 108, 57, 52; 438/14, 5–9, 202, 438/313; 257/E21; 324/702, 716; 430/30
See application file for complete search history.

(56) References Cited

U.S. PATENT DOCUMENTS 5,969,428 A * 10/1999 Nomura et al. ............. 257/797
6,259,525 B1 * 7/2001 David ........................ 356/399
6,383,888 B1 * 5/2002 Stirton ....................... 438/401
6,410,401 B1 * 6/2002 Ohtaka ....................... 438/401
6,537,835 B2 3/2003 Adachi et al.

(Continued)

FOREIGN PATENT DOCUMENTS

JP H06-301196 10/1994

(Continued)

OTHER PUBLICATIONS

Pei et al., In-Situ Thin Film Thickness Measurement Using Ultrasonics Waves, Center for Integrated System, Sanford University, Stanford, CA 94305, 1994, p. 1-4.*

(Continued)

*Primary Examiner*—Kidest Bahta
(74) *Attorney, Agent, or Firm*—Westerman, Hattori, Daniels & Adrian, LLP.

(57) ABSTRACT

Concerning a plurality of wafers which compose one lot, amounts of misalignment between alignment marks of these wafers and alignment patterns transferred on photoresists are measured in advance, and then, a mutual relation between a thickness of an interlayer dielectric film and a value of Wafer Scaling is calculated. When exposure is actually executed, first, an interlayer dielectric film is formed on the alignment marks in a lot and planarized. After that, the thickness of the interlayer dielectric film after planarization is measured. The value of the Wafer Scaling is estimated from an average value of the thicknesses of the interlayer dielectric films in the lot and the above-mentioned mutual relation. Then, photoresists are coated on the interlayer dielectric films in the lot, and the photoresists are exposed while the correction is executed so as to compensate the value of the Wafer Scaling.

10 Claims, 9 Drawing Sheets

U.S. PATENT DOCUMENTS

| | | | |
|---|---|---|---|
| 6,703,328 B2 * | 3/2004 | Tanaka et al. | 438/462 |
| 6,768,324 B1 * | 7/2004 | Yamada et al. | 324/751 |
| 2001/0026368 A1 * | 10/2001 | Mikami | 356/614 |
| 2002/0072195 A1 * | 6/2002 | Anma et al. | 438/401 |
| 2002/0158193 A1 * | 10/2002 | Sezginer et al. | 250/237 G |
| 2004/0002171 A1 | 1/2004 | Gotkis et al. | |

FOREIGN PATENT DOCUMENTS

| | | |
|---|---|---|
| JP | 7-167614 | 7/1995 |
| JP | H09-326349 | 12/1997 |
| JP | H10-208994 | 8/1998 |

OTHER PUBLICATIONS

Terada et al.; Thickness and compostion Measurement for thin film with combined X-ray Technique, IEEE/SEMI Advnced Semiconductor Manufacruring Conf., 1999, p. 414-419.*

* cited by examiner

METHOD AND APPARATUS FOR MANUFACTURING SEMICONDUCTOR DEVICE

CROSS-REFERENCE TO RELATED APPLICATIONS

This application is a Divisional application of application Ser. No. 10/682,299, filed Oct. 10, 2003, now U.S. Pat. No. 6,979,577 which is based upon and claims the benefit of priority from the prior Japanese Patent Application No. 2002-298749, filed on Oct. 11, 2002, the entire contents of which are incorporated herein by reference.

BACKGROUND OF THE INVENTION

1. Field of the Invention

The present invention relates to a method and an apparatus for manufacturing a semiconductor device using an aligner.

2. Description of the Related Art

Conventionally, photolithography technology is indispensable when manufacturing a semiconductor device. Exposure is executed on a photoresist under this photolithography technology. When this exposure is executed, plural wafers in an aligner are considered as one lot. Then, an alignment correction value is calculated every lot in the aligner, and the exposure is executed while correcting alignment based on this alignment correction value.

FIG. 12 is a flow chart showing a method for calculating an alignment correction value based on a prior art. In this prior art, first, one wafer is arbitrarily selected as a pilot from one lot, and the exposure of this wafer is executed (Step S1). Next, an amount of misalignment of this pilot is calculated, and a decision is made if this amount is within tolerance or not (Step S2). If the amount of misalignment is found within the tolerance by this decision, other wafers in this lot are exposed without correcting alignment (Step S3). If the amount of misalignment is found over the tolerance, both an alignment correction based on this amount of misalignment and regeneration of the wafer used as the pilot are executed (Step S4). Then, the exposure of this pilot is executed again (Step S1).

As another method, a trend of misalignment in the lot already exposed is found out before another lot is exposed, and then, the exposure is executed by correcting the alignment based on this trend.

As a further method, the exposure is executed by fixing the alignment correction value of the aligner.

A prior art is disclosed in Japanese Patent Laid-open Publication number Hei 07-167614.

However, it is difficult to execute the accurate correction when using the method for correcting based on the trend of misalignment and the method for fixing the alignment correction value. Especially, errors of the correction have become beyond the limit of what is acceptable due to recent miniaturization. On the other hand, it is possible to thoroughly correct the alignment when using the method for calculating the alignment correction value by extracting the pilot. However, problems of long time for a series of processes and high costs arise.

SUMMARY OF THE INVENTION

The present invention was invented in consideration of the above-described problems. An object of the present invention is to provide a method and an apparatus for manufacturing a semiconductor device which enable to correct the alignment accurately and simply without using the pilot.

After extremely careful consideration, inventors of this invention invented that an accurate alignment correction could be executed without a pilot by paying attention of a thickness of an interlayer dielectric film formed under a photoresist, finding out a mutual relation between the thickness and Wafer Scaling, and exposing the photoresist based on the mutual relation. The inventors of the present invention made up the following embodiments.

A method for manufacturing a semiconductor device according to a first aspect of this invention is intended for a method for manufacturing a semiconductor device which comprises a step of measuring a thickness of a film formed on a layer with an alignment mark and a step of exposing a photoresist formed on the film. Furthermore, according to this aspect of the present invention, the step of exposing the photoresist includes a step of controlling a correction of misalignment during exposure based on the thickness of the film.

A method for manufacturing a semiconductor device according to a second aspect of this invention is intended for a method for manufacturing a semiconductor device which comprises a step of forming a film on a layer with an alignment mark, a step of coating a photoresist on the film, a step of exposing the photoresist, a step of patterning the photoresist by developing the photoresist, and a step of processing the film using the photoresist as a mask. Furthermore, according to this aspect of the present invention, the step of exposing the photoresist includes a step of correcting misalignment based on a thickness of the film.

A apparatus for manufacturing a semiconductor device according to a third aspect of the present invention comprises a film thickness measure for measuring a thickness of a film formed on a layer with an alignment mark and an aligner for exposing a photoresist formed on the film. Furthermore, this aspect of the present invention comprises an alignment controller for controlling a correction of misalignment in the aligner based on the thickness measured by the film thickness measure when the photoresist is exposed.

DETAILED DESCRIPTION OF THE PREFERRED EMBODIMENTS

A detailed description of a method and an apparatus for manufacturing a semiconductor device, and a control program and a recording medium of an aligner relating to the embodiments of the present invention are given hereinafter with reference to the attached drawings. FIGS. 1 to 5 are schematic diagrams showing correction items in alignment.

As described above, an alignment correction is executed in the aligner. Correction items of alignment include for example, Wafer Scaling shown in FIG. 1, Wafer Offset (Average) shown in FIG. 2, Wafer Rotation shown in FIG. 3, Chip Rotation shown in FIG. 4, and Chip Magnification shown in FIG. 5.

The Wafer Scaling is the item showing how much misalignment is toward a radial direction of a wafer considering a center of the wafer as a basis, which means how much misalignment of a rate of enlargement is to the whole wafer. The Wafer Offset is the item showing how much exposure fields slide in parallel with reference to the whole wafer. The Wafer Rotation is the item showing how much the exposure fields slide by rotating considering the center of the wafer as a center of rotation.

The Chip Rotation is the item showing how much the exposure fields slide by rotating considering the center of the chip as a center of rotation. The Chip Magnification is the item showing how much misalignment is toward the radial direction of the chip considering the center of the chip as the basis.

The present invention is especially effective for the Wafer Scaling among the above-mentioned items.

Figure 1:
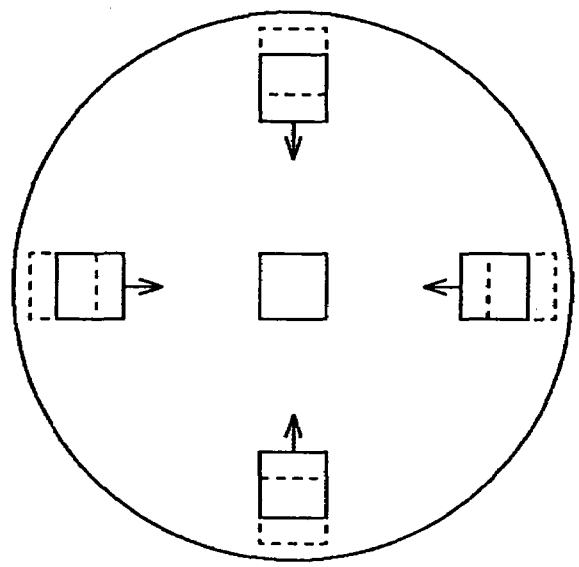
FIG. 1 is a schematic diagram showing a correction item (Wafer Scaling) of alignment.
Figure 2:
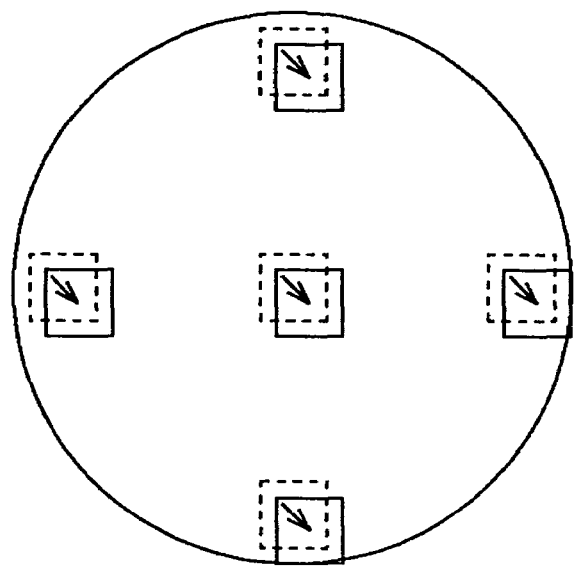
FIG. 2 is a schematic diagram showing a correction item (Wafer Offset) of alignment.
Figure 3:
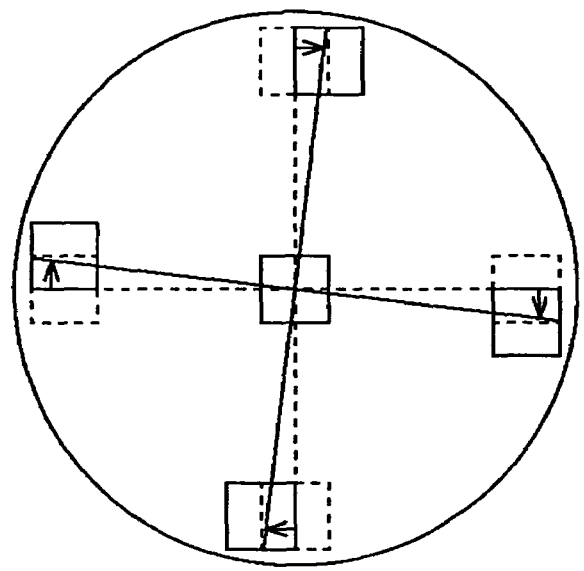
FIG. 3 is a schematic diagram showing a correction item (Wafer Rotation) of alignment.
Figure 4:
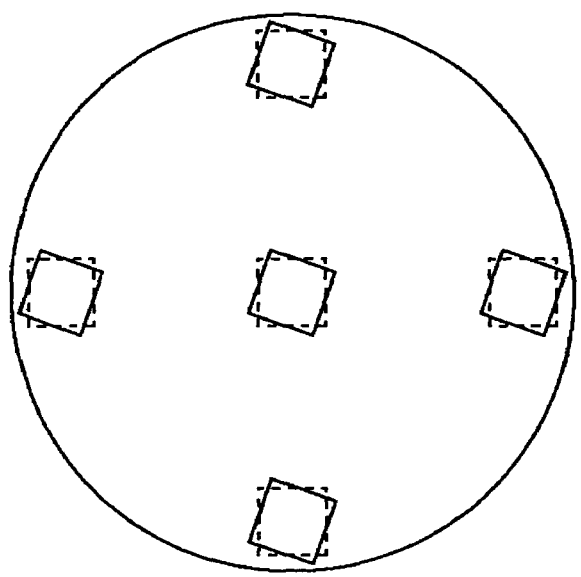
FIG. 4 is a schematic diagram showing a correction item (Chip Rotation) of alignment.
Figure 5:
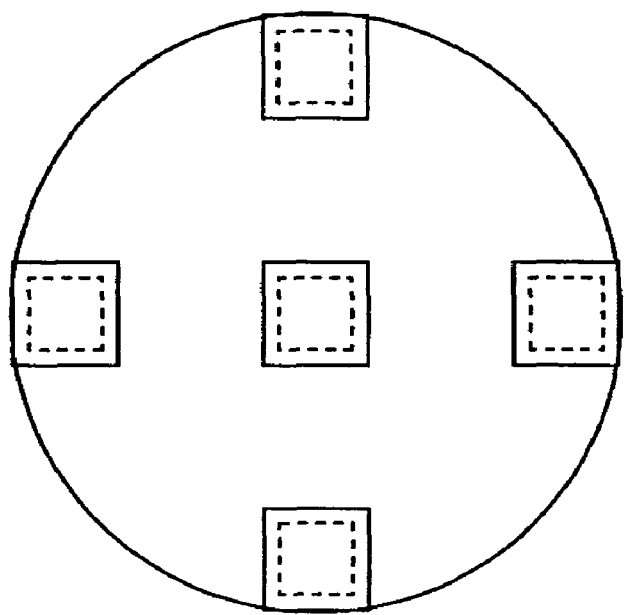
FIG. 5 is a schematic diagram showing a correction item (Chip Magnification) of alignment.
Figure 6:
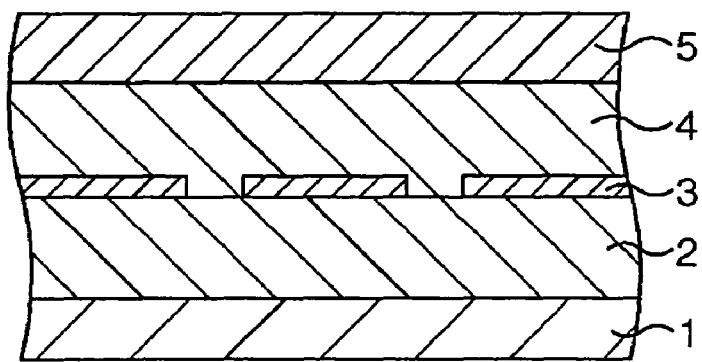
FIG. 6 is a cross sectional view showing an example of alignment marks.

FIG. 6 is a cross sectional view showing an example of alignment marks. In this example, an interlayer dielectric film 2 made of $SiO_2$ is formed on a semiconductor substrate, for example, a Si substrate 1. A wiring layer (not shown) is formed on this interlayer dielectric film 2, and alignment marks (residual marks) 3 are formed on the same layer with the wiring layer. The wiring layer and the alignment marks 3 are composed of for example, Al or Cu. An interlayer dielectric film 4 made of $SiO_2$ is formed on the wiring layer and the alignment marks 3. On this interlayer dielectric film 4, a photoresist 5 used as a mask when a hole or a groove reaching to the wiring layer is formed in this interlayer dielectric film 4 is formed. Both interlayer dielectric films 2 and 4 are films which transmit lights.

A detailed description of a preferred embodiment of the present invention will be given hereinafter. In this embodiment, concerning from 10 to 20 pieces or more of wafers which compose one lot, the interlayer dielectric films 4 are formed on the alignment marks 3. After they are planarized by a Chemical Mechanical Polish (CMP), thicknesses of the interlayer dielectric films 4 are measured. The thickness of the interlayer dielectric film 4 can be measured by for example, a thicknessmeter equipped in a CMP tool used for planarization of the interlayer dielectric 4.

Figure 7:
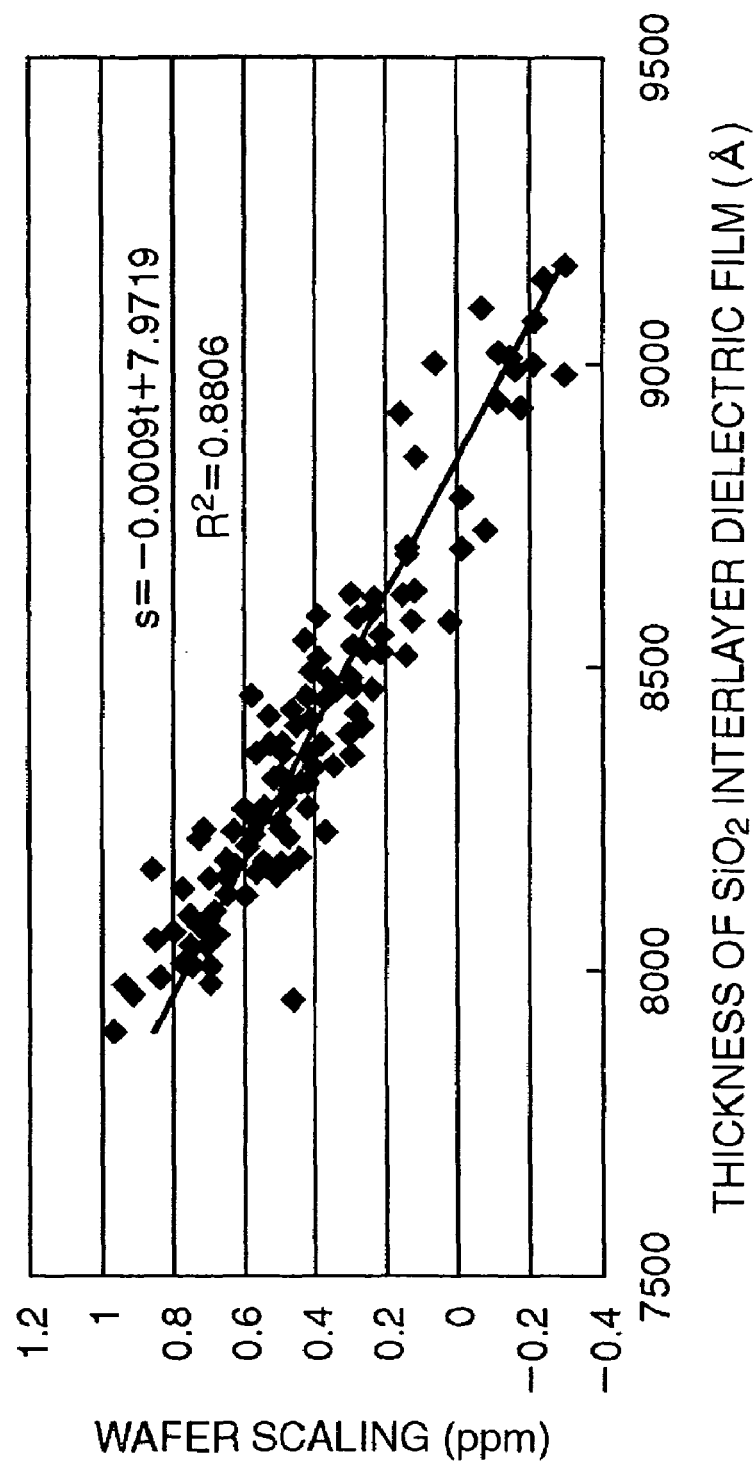
FIG. 7 is a graph showing a relation between a thickness of an interlayer dielectric film and a value of Wafer Scaling.

Photoresists 5 are coated on the wafers on which the interlayer dielectric films 4 have been formed, and exposure is executed. After the photoresists are developed, amounts of misalignments between the alignment marks 3 of these wafers and alignment patterns transferred on the photoresists are measured, and then, a relation between the thickness of the interlayer dielectric film 4 and a value of the Wafer Scaling is calculated. The value of the Wafer Scaling is a value of the amount of misalignment of any point on the wafer divided by a distance between this point and the center of the wafer. Accordingly, the value of Wafer Scaling is standardized by the distance from the center. FIG. 7 is a graph showing a relation between the thickness of the interlayer dielectric 4 and the value of the Wafer Scaling obtained through the above-described steps. A positive value of the Wafer Scaling means misalignment toward the center of the wafer, and a negative value thereof means misalignment away from the center of the wafer.

As shown in FIG. 7, the relation between the thickness of the interlayer dielectric film 4 and the value of the Wafer Scaling is indicated as for example, a linear function. In FIG. 7, a "t" stands for the thickness of the interlayer dielectric film 4, an "s" for the value of the Wafer Scaling, and an "R" for a correlation coefficient.

After the relation between the thickness of the interlayer dielectric film 4 and the value of the Wafer Scaling is calculated, the interlayer dielectric films 4 are formed on the alignment marks 3 and planarized in one lot. Then, the thickness of each of the interlayer dielectric films 4 after planarization is measured. A central value of the thicknesses of the interlayer dielectric films 4 in the lot, for example, an average value, is substituted for the "t" of the linear function expression derived from FIG. 7, and the value of the Wafer Scaling "s" is calculated.

Then, the photoresists 5 are coated on the interlayer dielectric films 4 in the lot, and the photoresists 5 are exposed while a correction is executed so as to compensate the calculated value of the Wafer Scaling "s".

After that, the thicknesses of each of the interlayer dielectric films 4 in other lots are measured, and the photoresists 5 are exposed while a correction is executed so as to compensate the value of the Wafer Scaling "s" based on the central value, for example, the average value, and the relation derived from FIG. 7.

An alignment correction of all lots is executed according to the above-described method.

According to this embodiment, an accurate alignment correction of all lots can be executed without calculating the amount of misalignment by choosing a pilot of every lot. This is because the inventor of the present invention found out that there is a mutual relation between the thickness of a lower layer under the photoresist, that is, the thickness of the interlayer dielectric film 4 in the present embodiment and the value of the Wafer Scaling, and because the value of the Wafer Scaling which will be actually calculated can be estimated just by measuring a thickness of a base film, if the mutual relation is calculated in advance.

When a semiconductor device is actually manufactured, for example, first, a transistor or the like is formed on the semiconductor substrate. Then, an interlayer dielectric film which covers them is formed, and a contact hole is formed in the interlayer dielectric film. Furthermore, another interlayer dielectric film is formed and a groove or the like is formed by using a damascene method or the like. This embodiment is suitable for forming the contact hole and the groove among a series of the processes.

Figure 8:
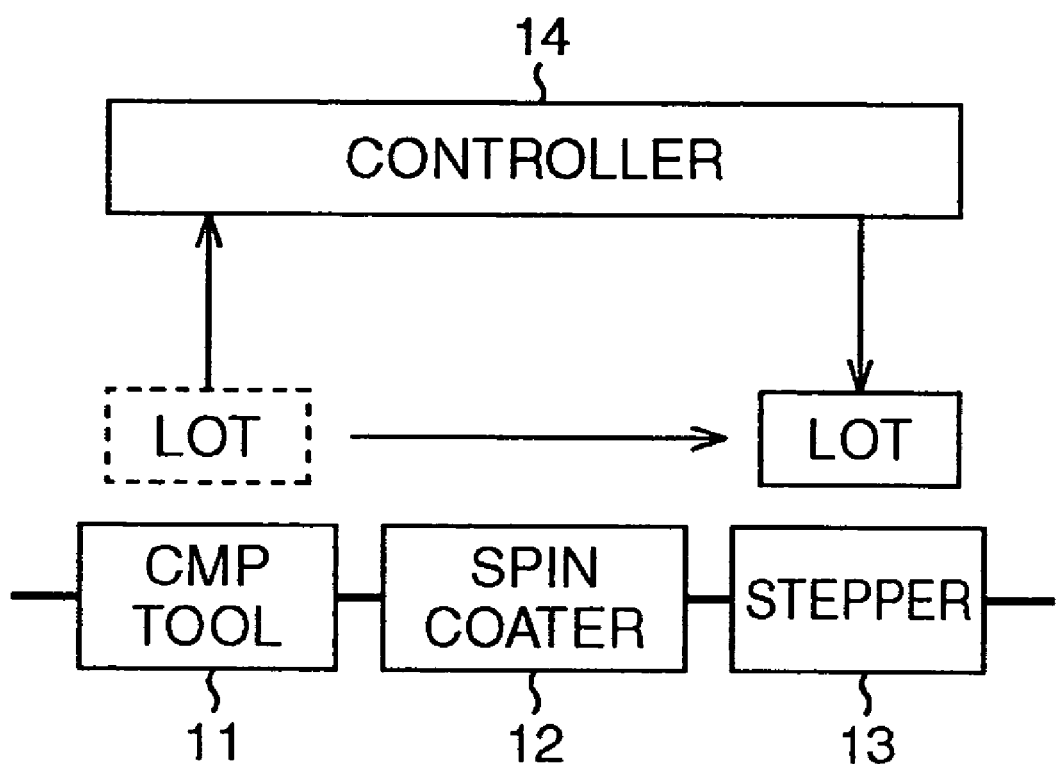
FIG. 8 is a schematic diagram showing a apparatus for manufacturing a semiconductor device relating to an embodiment of this invention.

Next, a detailed description of an apparatus for manufacturing a semiconductor device for conducting the method for manufacturing a semiconductor device relating to the above-mentioned embodiment is given hereinafter. FIG. 8 is a schematic diagram showing the apparatus for manufacturing a semiconductor device relating to the embodiment of the present invention.

A CMP tool 11, a spincoater 12, a stepper 13, and a controller 14 are provided in the manufacturing apparatus. The CMP tool 11 executes planarization processes of the interlayer dielectric film 4, which is a lower layer of the photoresist 5, measures the thickness of the interlayer dielectric film 4 after the planarization processes, and outputs the central value, for example, the average value, of every lot to the controller 14. The spincoater 12 spin-coats the photoresist 5 on the interlayer dielectric film 4. A storage unit such as a memory or the like is provided in the controller 14. The relation between the thickness of the interlayer dielectric film 4 and the value of the Wafer Scaling, which was calculated in advance and shown in FIG. 7, is stored in this storage unit. When the thickness of the interlayer dielectric film 4 measured by the CMP tool 11 of every lot is inputted to the controller 14, the above-mentioned mutual relation is read out of the storage unit, and the alignment correction value for compensating the amount of misalignment based on this mutual relationship is outputted to the stepper 13. The stepper 13 exposes the photoresist 5 under exposure conditions including the correction value inputted from the controller 14. The storage unit of the controller 14 does not have to be built in the controller 14. A flexible disk in which the mutual relation is recorded, or a drive for reading out the mutual relation from a recording medium such as CD-ROM, or the like is acceptable.

The mutual relation shown in FIG. 7 is proximate to a linear function to each point of measurement; however, it can be proximate to a trigonometric function.

A kind of the interlayer dielectric film is not limited; for example, a silicon nitride film can be replaced therewith.

The embodiment of the present invention can be realized when a computer executes a program. Means for providing the program to the computer, for example, a computer readable recording medium such as CD-ROM or the like in which the program is recorded, or a transmission medium such as Internet or the like which transmits the program, is applicable to the embodiment of this invention. The above-mentioned program, the recording medium, the transmission medium, and a program product are in a category of this invention.

A result of applying this invention to the Wafer Scaling and actually manufacturing the semiconductor device is explained hereinafter.

Figure 9A:
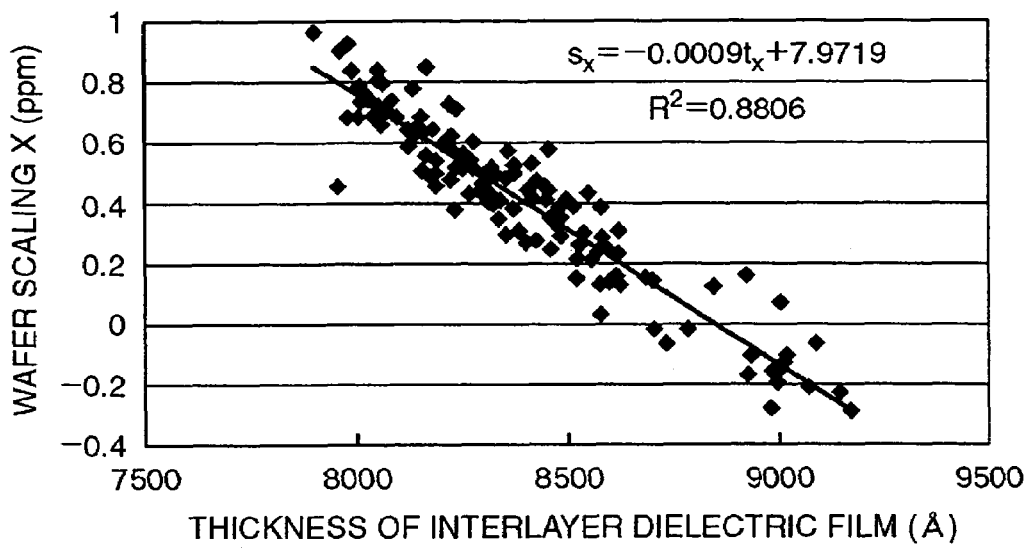
FIGS. 9A and 9B are graphs showing relations between a thickness of an interlayer dielectric film calculated in advance and a value of Wafer Scaling.
Figure 9B:
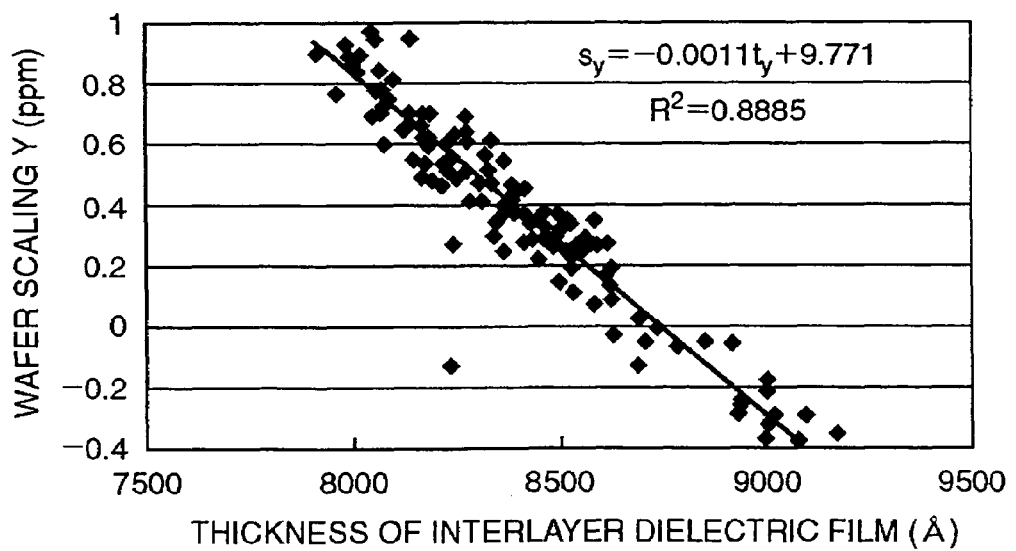

FIGS. 9A and 9B are graphs showing relations between the thickness of the interlayer dielectric film and the value of the Wafer Scaling calculated in advance. In these drawings, one arbitrary direction of the wafer is defined as an X-direction, and an orthogonal direction to it is defined as a Y-direction. Then, the mutual relations between these directions are calculated before actually manufacturing the semiconductor device. FIG. 9A shows the mutual relation along the X-direction, and FIG. 9B shows the mutual relation toward the Y-direction.

The manufacturing apparatus shown in FIG. 8 was used in an example to which the present invention was applied. After the interlayer dielectric films were formed on the wafers in one lot, they were planarized, and the average value of film thicknesses was measured on the X-direction and the Y-direction. Then, the photoresists were coated on the interlayer dielectric films. The value of the Wafer Scaling was calculated based on FIGS. 9A and 9B, and exposure and development of the photoresists were executed so as to compensate the above-described value. PFI32A8 manufactured by Sumitomo Chemical Co., Ltd. is used as a photoresist, and FPA3000I5 manufactured by Canon Inc. is used as an aligner.

Figure 10:
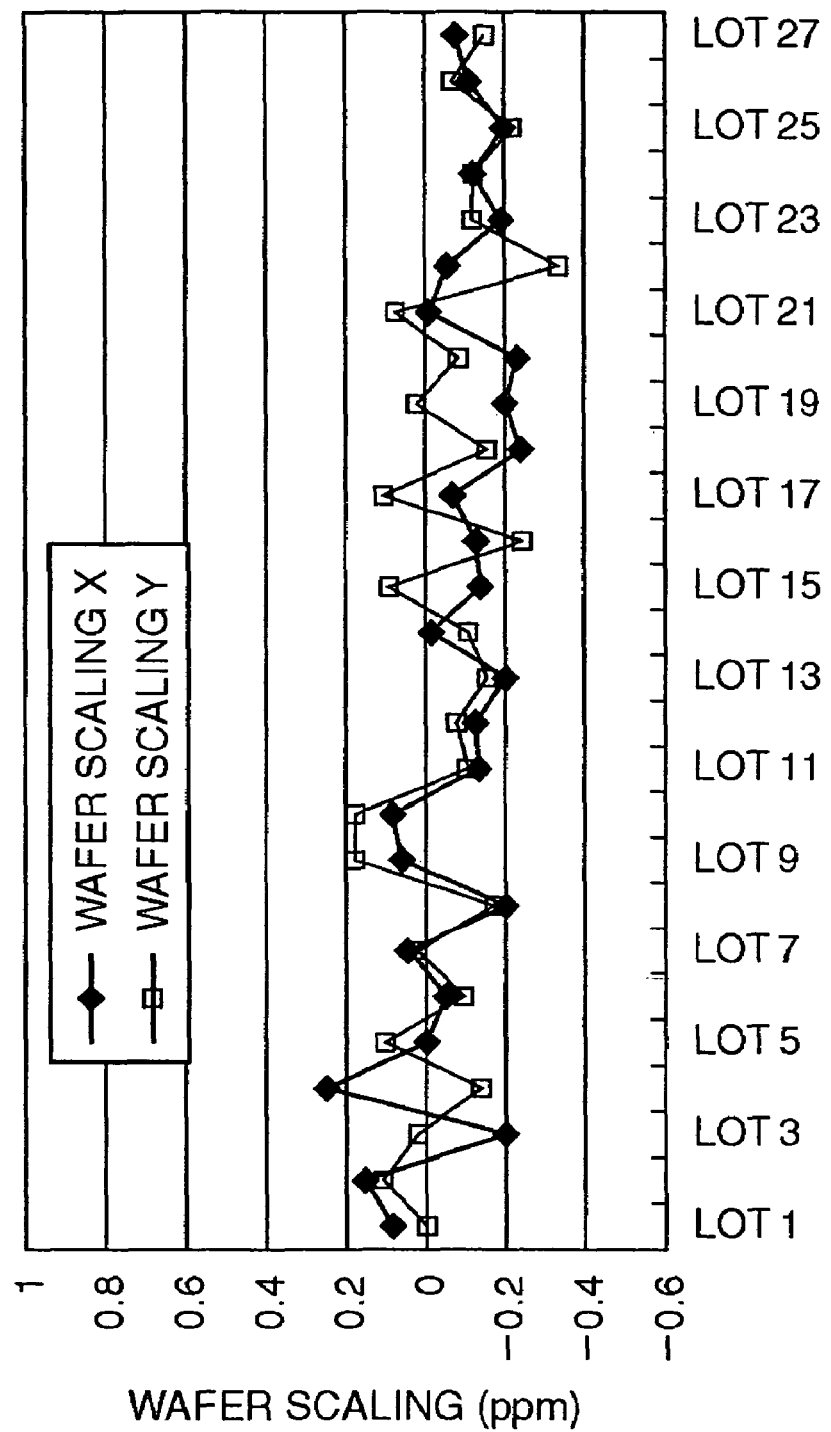
FIG. 10 is a graph showing fluctuation of Wafer Scaling when using the semiconductor device, obtained through an example according to the present invention.

These processes were carried out for a total of 27 lots. FIG. 10 is a graph showing fluctuation of the Wafer Scaling in the semiconductor device, obtained through the example.

Furthermore, exposure and development of the photoresists were executed by fixing the alignment correction value as a comparison to the above-mentioned example. The result is shown in FIG. 11.

Figure 11:
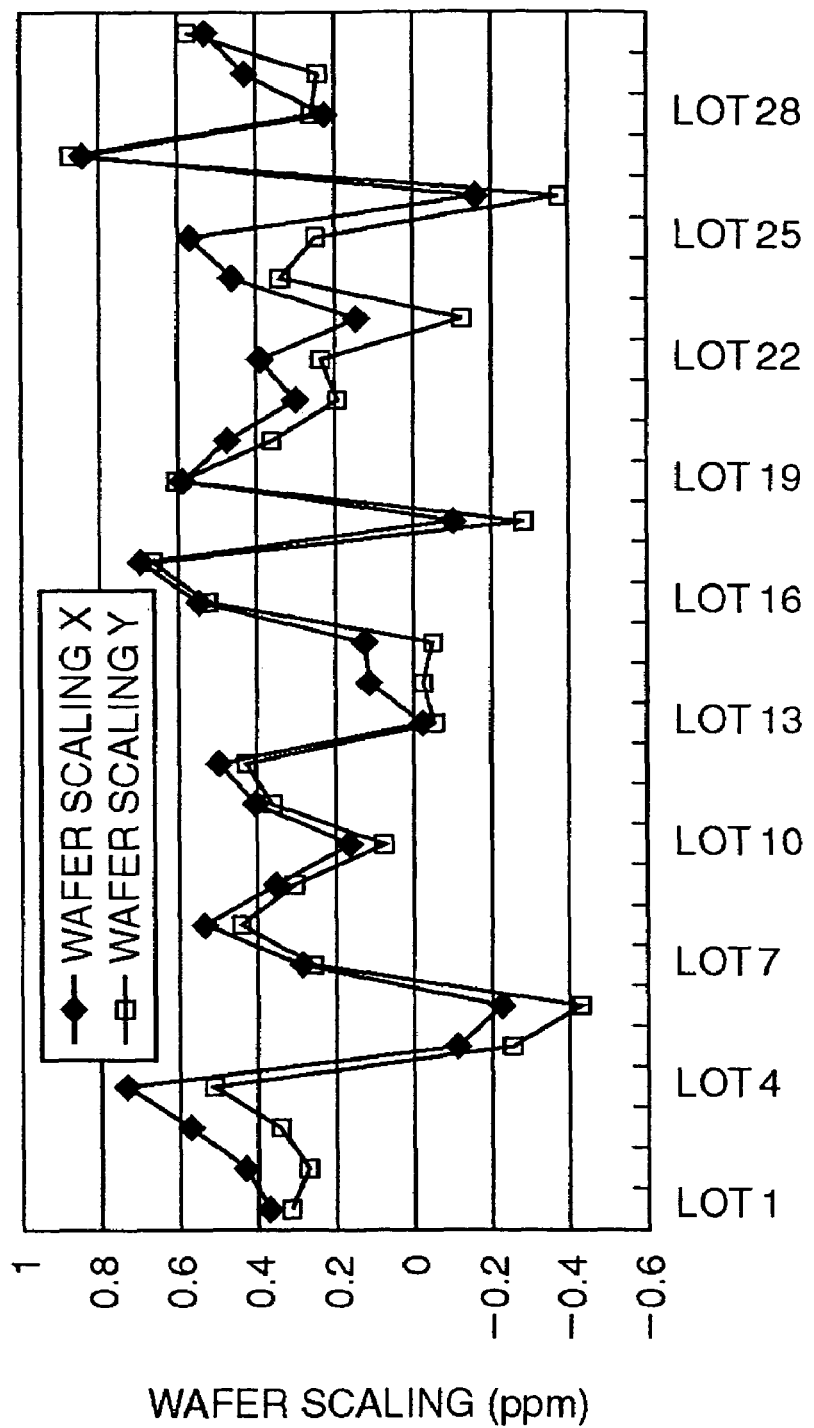
FIG. 11 is a graph showing fluctuation of Wafer Scaling in the semiconductor device, obtained through a comparative example.
Figure 12:
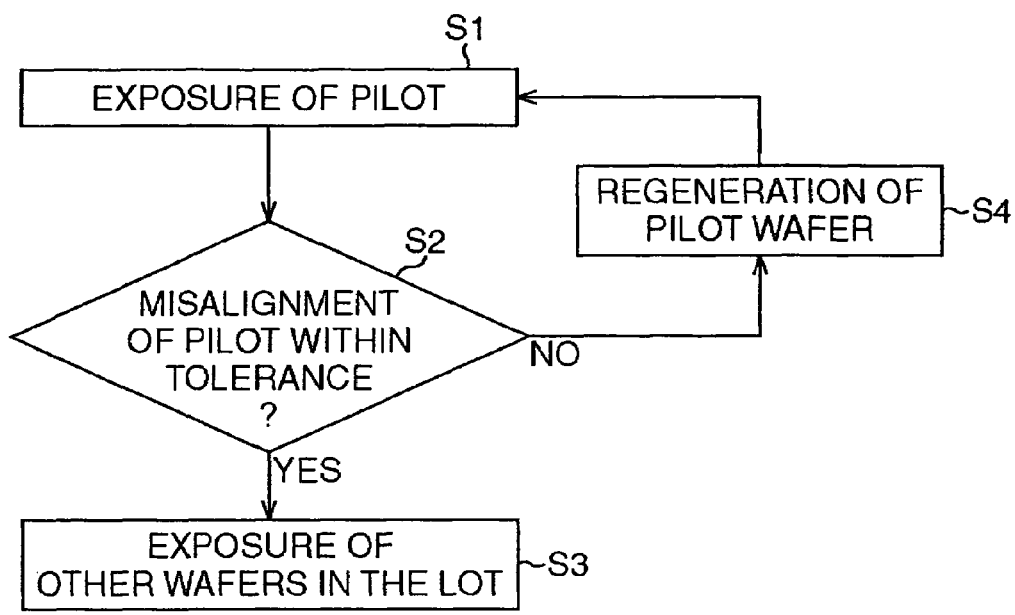
FIG. 12 is a flow chart showing a method for calculating an alignment correction value based on a prior art.

As shown in FIG. 11, when the correction of the Wafer Scaling was not executed, a data spread of the Wafer Scaling was 1.2 ppm. In contrast, according to the example of the present invention as can be seen in FIG. 10, a data spread of the Wafer Scaling of the wafer after development was reduced to 0.4 ppm. This means that the data spread of the Wafer Scaling could be reduced to the extent to one third according to the example.

As described above, an accurate alignment correction can be executed without an alignment correction by extracting a pilot. Accordingly, the number of regeneration of exposure processes can be decreased, and high yields can be obtained with less process time and lower cost.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. An apparatus for manufacturing a semiconductor device, comprising:
    a film thickness measure measuring a thickness of a film formed on a layer with an alignment mark, said film covering said alignment mark and being a component of the semiconductor device;
    an aligner exposing a photoresist formed on the film; and
    an alignment controller controlling a correction of misalignment in the aligner based on the thickness measured by said film thickness measure when the photoresist is exposed, said film being an object of processing in which the photoresist is used as a mask after the correction of misalignment.

2. The apparatus for manufacturing a semiconductor device according to claim 1, wherein
    said alignment controller includes a storage for storing a mutual relation calculated in advance between a thickness of the film and an amount of the misalignment of a pattern transferred on the photoresist by the exposure against the alignment mark, and
    said alignment controller corrects the misalignment based on the mutual relation.

3. The apparatus for manufacturing a semiconductor device according to claim 1, wherein
    said alignment controller corrects misalignment of Wafer Scaling as the correction of the misalignment.

4. The apparatus for manufacturing a semiconductor device according to claim 1, wherein
    said alignment controller corrects at least one kind of misalignment selected from a group of Wafer Offset, Wafer Rotation, Chip Rotation, and Chip Magnification as the correction of the misalignment.

5. A program product for making a computer control an operation of an aligner which exposes a photoresist, the program product comprising:
    a first computer readable program code means for reading out a mutual relation from a storage which stores the mutual relation between a thickness of a film and an amount of misalignment of a pattern transferred on a photoresist by exposure against an alignment mark, the mutual relation being calculated in advance, when a thickness of a film on which the photoresist is formed is inputted, said film covering said alignment mark and being a component of a semiconductor device; and a second computer readable program code means for controlling a correction of misalignment in the aligner based on the thickness of the film, said film being an object of processing in which the photoresist is used as a mask after the correction of misalignment.

6. The program product according to claim 5, wherein the computer is made to correct misalignment of Wafer Scaling as the correction of misalignment by said second computer readable program code means.

7. The program product according to claim 5, wherein the computer is made to correct at least one kind of misalignment selected from a group of Wafer Offset, Wafer Rotation, Chip Rotation, and Chip Magnification as the correction of misalignment by said second computer readable program code means.

8. A computer readable storage medium storing a computer program code means for making a computer control an operation of an aligner which exposes a photoresist, the computer program code means, comprising:

a first computer readable program code means for reading out a mutual relation from a storage which stores the mutual relation between a thickness of a film and an amount of misalignment of a pattern transferred on the photoresist by exposure against an alignment mark, the mutual relation being calculated in advance, when a thickness of a film on which the photoresist is formed is inputted, said film covering said alignment mark and being a component of a semiconductor device; and a second computer readable program code means for controlling a correction of misalignment in the aligner based on the thickness of the film, said film being an object of processing in which the photoresist is used as a mask after the correction of misalignment.

9. The computer readable storage medium according to claim 8, wherein the computer is made to correct misalignment of Wafer Scaling as the correction of misalignment by said second computer readable program code means.

10. The computer readable storage medium according to claim 8, wherein the computer is made to correct at least one kind of misalignment selected from a group of Wafer Offset, Wafer Rotation, Chip Rotation, and Chip Magnification as the correction of the misalignment by said second computer readable program code means.

* * * * *